US010468290B2

(12) United States Patent
Ellis et al.

(10) Patent No.: US 10,468,290 B2
(45) Date of Patent: Nov. 5, 2019

(54) WAFER CHUCK APPARATUS WITH MICRO-CHANNEL REGIONS

(71) Applicant: Ultratech, Inc., San Jose, CA (US)

(72) Inventors: Raymond Ellis, Aptos, CA (US); A. J. Crespin, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/729,877

(22) Filed: Oct. 11, 2017

(65) Prior Publication Data

US 2018/0122681 A1    May 3, 2018

Related U.S. Application Data

(60) Provisional application No. 62/416,262, filed on Nov. 2, 2016.

(51) Int. Cl.
| | |
|---|---|
| *H01L 21/683* | (2006.01) |
| *H01L 21/67* | (2006.01) |
| *H01L 21/687* | (2006.01) |
| *B23B 31/30* | (2006.01) |

(52) U.S. Cl.
CPC ........ *H01L 21/6838* (2013.01); *B23B 31/307* (2013.01); *Y10T 279/11* (2015.01)

(58) Field of Classification Search
CPC ........... H01L 21/6838; H01L 21/67288; Y10T 279/11; B23B 31/307
See application file for complete search history.

(56) References Cited

U.S. PATENT DOCUMENTS

| | | | |
|---|---|---|---|
| 2,366,935 A | | 1/1945 | Schmid |
| 2,955,829 A | | 10/1960 | Brewster |
| 3,849,948 A | * | 11/1974 | Youmans ............. B24B 37/042 |
| | | | 257/E21.214 |
| 4,006,909 A | | 2/1977 | Ollendorf et al. |
| 4,448,404 A | | 5/1984 | Ogawa et al. |
| 4,603,466 A | | 8/1986 | Morley |
| 4,869,481 A | | 9/1989 | Yabu et al. |
| 5,033,538 A | | 7/1991 | Wagner et al. |
| 5,094,536 A | | 3/1992 | MacDonald et al. |
| 5,324,012 A | | 6/1994 | Aoyama et al. |
| 5,370,709 A | | 12/1994 | Kobayashi |
| 5,492,566 A | | 2/1996 | Sumnitsch |
| 5,534,073 A | | 7/1996 | Kinoshita et al. |
| 6,032,997 A | | 3/2000 | Elliott et al. |
| 6,164,633 A | | 12/2000 | Mulligan et al. |
| 6,257,564 B1 | | 7/2001 | Avneri et al. |

(Continued)

*Primary Examiner* — Eric A. Gates
(74) *Attorney, Agent, or Firm* — Downs Rachlin Martin PLLC

(57) ABSTRACT

The wafer chuck apparatus has a chuck body that includes an interior and a top surface. A plurality of micro-channel regions is formed in the top surface. Each micro-channel region is defined by an array of micro-channel sections that are in pneumatic communication with each other. The micro-channel regions are pneumatically isolated from each other. One or more vacuum manifold regions are defined in the interior of the chuck body and are in pneumatic communication with corresponding micro-channel regions through respective vacuum holes. The configuration of the micro-channel regions makes the wafer chuck apparatus particularly useful in chucking wafers that have a substantial amount of warp.

8 Claims, 9 Drawing Sheets

(56) References Cited

U.S. PATENT DOCUMENTS

| | | |
|---|---|---|
| 6,446,948 B1 | 9/2002 | Allen |
| 6,538,733 B2 | 3/2003 | Gaal et al. |
| 6,722,642 B1 | 4/2004 | Sutton et al. |
| 6,966,560 B2 * | 11/2005 | Demel ................ H01L 21/6838 118/500 |
| 7,033,445 B2 * | 4/2006 | Keeton ............. H01L 21/67103 118/500 |
| 7,292,427 B1 | 11/2007 | Murdoch et al. |
| 7,543,867 B2 | 6/2009 | Pun et al. |
| 8,198,567 B2 * | 6/2012 | Lerner ................. B25B 11/005 118/728 |
| 8,336,188 B2 | 12/2012 | Monteen et al. |
| 8,506,363 B2 * | 8/2013 | Takahashi ............... B24B 37/30 451/289 |
| 8,613,474 B2 | 12/2013 | Goodman et al. |
| 8,695,990 B2 * | 4/2014 | Vodanovic .......... H01L 21/6838 279/3 |
| 9,508,578 B2 * | 11/2016 | Adderly ............ H01L 21/67288 |
| 9,558,985 B2 * | 1/2017 | Wang .................. H01L 21/6838 |
| 9,653,338 B2 * | 5/2017 | Huang ................ H01L 21/6838 |
| 2005/0035514 A1 | 2/2005 | Hillman et al. |
| 2009/0031955 A1 * | 2/2009 | Lu ....................... C23C 16/4584 118/728 |
| 2015/0228528 A1 * | 8/2015 | Behdjat .............. H01L 21/6838 219/392 |
| 2016/0192444 A1 * | 6/2016 | Matsushita .............. H05B 3/26 219/521 |
| 2016/0195579 A1 * | 7/2016 | Simmons ............ H01L 21/6838 269/21 |
| 2018/0144959 A1 * | 5/2018 | Nemani ................. G01R 29/12 |

* cited by examiner

WAFER CHUCK APPARATUS WITH MICRO-CHANNEL REGIONS

RELATED APPLICATION DATA

This application claims the benefit of priority of U.S. Provisional Patent Application Ser. No. 62/416,262, filed on Nov. 2, 2016, and titled "Wafer Chuck Apparatus With Micro-Channel Regions," which is incorporated by reference herein in its entirety.

FIELD OF THE INVENTION

The present disclosure relates to chuck apparatus used to support wafers in semiconductor manufacturing, and in particular relates to a wafer chuck apparatus with micro-channel regions.

BACKGROUND

The manufacturing of semiconductor devices such as integrated circuit (IC) chips utilizes wafers of various types. For example, semiconductor wafers serve as a substrate in which the various three-dimension IC structures are formed using a series of process steps. Once the IC chips are formed, they then need to be packaged, i.e., encapsulated in a support wafer to form the finalized IC device.

To perform lithography exposures either when fabricating the IC or when packaging the ICs, the wafer must be held very flat. This requires holding the wafer down to a very flat surface using a vacuum. To this end, vacuum chucks have been developed to support wafers during lithography exposures.

With the advances in semiconductor IC fabrication and packaging, the wafers have increased in size and tend to have larger amounts of deformation, i.e., deviation from perfect planarity. Unfortunately, when a deformed wafer is placed on a standard vacuum chuck, there is too much leakage to generate the pressure differential necessary to pull the wafer down to the chuck surface so that the wafer can be processed in a substantially planar state.

SUMMARY OF THE DISCLOSURE

An aspect of the disclosure is a chuck apparatus for supporting a wafer. The chuck apparatus includes: a chuck body having a center, an interior and a top side with a top surface; a plurality of micro-channel regions formed in the top surface, with each micro-channel region comprising an array of concentric arcuate micro-channel sections that are in pneumatic communication with one another, the micro-channel regions being pneumatically isolated from each other; and at least one vacuum manifold region defined in the interior of the chuck body and that is in pneumatic communication with each of the micro-channel regions through respective vacuum holes.

Another aspect of the disclosure is the chuck apparatus as described above, wherein the micro-channel sections within each micro-channel regions are defined by sidewalls having respective top surfaces that define the top surface of the chuck body.

Another aspect of the disclosure is the chuck apparatus as described above, wherein the top surface of the chuck body has a contact area $A_S$, the top side of the chuck body has a total area $A_{CT}$, and wherein a chuck contact-area ratio $R_{CT}=A_S/A_{CT}$ is in the range $0.20 \leq R_{CT} \leq 0.35$.

Another aspect of the disclosure is the chuck apparatus as described above, wherein each micro-channel region has a total area $A_{RT}$ and a contact surface area $A_R$, wherein a micro-channel region contact-area ratio $R_{CR}=A_R/A_{RT}$ is in the range $0.20 \leq R_{CR} \leq 0.35$.

Another aspect of the disclosure is the chuck apparatus as described above, wherein each sidewall includes a groove that provides the pneumatic communication between the micro-channel sections.

Another aspect of the disclosure is the chuck apparatus as described above and further including a vacuum pump pneumatically connected to the at least one vacuum manifold.

Another aspect of the disclosure is the chuck apparatus as described above, wherein the plurality of micro-channel regions is defined by between 25 and 250 micro-channel regions.

Another aspect of the disclosure is the chuck apparatus as described above and further including at least three through holes formed in the chuck body and each sized to pass a lift pin.

Another aspect of the disclosure is the chuck apparatus as described above, wherein the top side includes a plurality of radially defined segments that each include the plurality of micro-channel regions.

Another aspect of the disclosure is a chuck apparatus for securing a wafer. The chuck apparatus includes: a chuck body having a center, an interior and a top side with a top surface; a plurality of micro-channel regions formed in the top surface, with each micro-channel region comprising an array of micro-channel sections that are defined by sidewalls and that are in pneumatic communication with one another through grooves in the sidewalls, the micro-channel regions being pneumatically isolated from each other; and at least one vacuum manifold region defined in the interior of the chuck body and that is in pneumatic communication with each of the micro-channel regions through respective vacuum holes.

Another aspect of the disclosure is the chuck apparatus as described above, wherein at least some of the micro-channel sections in a given micro-channel region are concentrically arranged.

Another aspect of the disclosure is the chuck apparatus as described above, wherein at least some of the micro-channel sections have an arcuate shape.

Another aspect of the disclosure is the chuck apparatus as described above, wherein at least one vacuum manifold region comprises multiple vacuum manifold regions, with each vacuum manifold region in pneumatic communication with a corresponding vacuum region of the top side of the chuck body.

Another aspect of the disclosure is the chuck apparatus as described above, wherein each micro-channel region has a total area $A_{RT}$ and a contact surface area $A_R$, wherein a micro-channel contact-area ratio $R_{CR}=A_R/A_{RT}$ is in the range $0.20 \leq R_{CR} \leq 0.35$.

Another aspect of the disclosure is the chuck apparatus as described above, wherein the plurality of micro-channel regions is defined by between 25 and 250 micro-channel regions.

Another aspect of the disclosure is the chuck apparatus as described above, wherein the top surface of the chuck body has a contact area $A_S$, the top side of the chuck body has a total area $A_{CT}$, and wherein a chuck contact-area ratio $R_{CT}=A_S/A_{CT}$ is in the range $0.20 \leq R_{CT}\ 0.35$.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation. A radial coordinate r is also shown in some of the Figures for the sake of reference and is not intended to be limiting as to direction or orientation.

Wafer Chuck Apparatus

Figure 1:
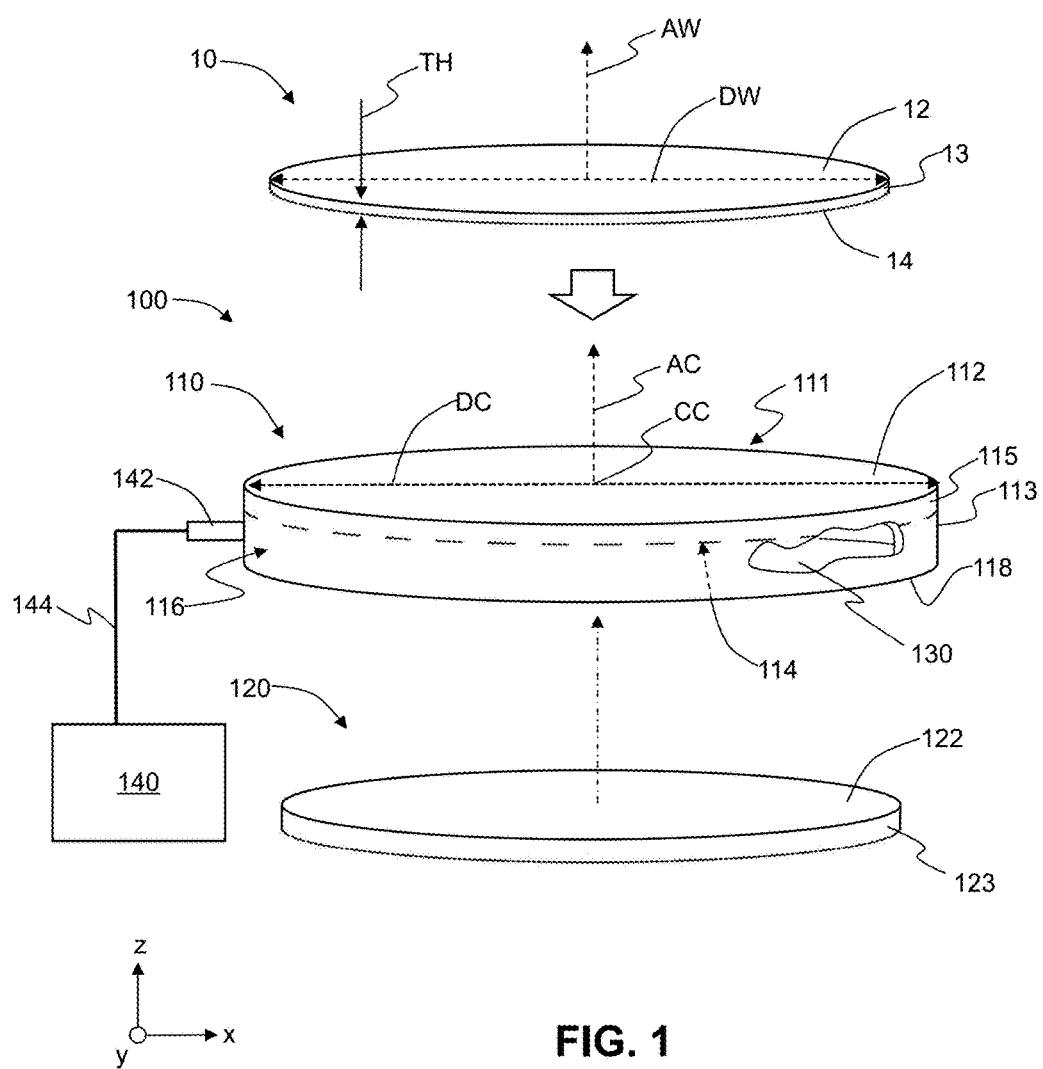
FIG. 1 is an elevated and partially exploded view of an example wafer chuck apparatus as disclosed herein shown along with an example wafer.

FIG. 1 is an elevated view of an example wafer chuck apparatus 100 as disclosed herein shown along with an example wafer 10 with a diameter DW. The wafer chuck apparatus 100 includes a micro-channel chuck ("chuck") 110. The chuck 110 includes a body 111 with a top side 112 and a perimeter 113. The top side 112 is defined by a platen 115 that includes a top surface 112S (see FIG. 6A) and a bottom surface or "backside" 114.

The body 111 of chuck 110 also includes a cylindrical wall 116 (see also FIG. 7) that downwardly depends from the backside 114 of platen 115 at perimeter 113. The cylindrical wall 116 includes a bottom edge 118 to which is secured a plate 120 having a top surface 122 and a perimeter 123. The top surface 122 of plate 120, the backside 114 of platen 115 and the cylindrical wall 116 define a chuck interior 130. In an example, the platen 115 and cylindrical wall 116 are formed as a unitary structure, i.e., from a single piece of material formed by a molding process and then machined. An example material for chuck 110 is aluminum, silicon carbide (SiC), or a lithium-aluminosilicate glass-ceramic, such as ZERODUR® glass, available from Schott AG, Mainz, Germany.

The chuck 110 has a dimension (e.g., diameter) DC sized to accommodate wafers 10 having a range of diameters DW. The chuck 110 has a chuck axis AC that runs in the z-direction through a chuck center CC.

The wafer chuck apparatus 100 also includes a vacuum pump 140 pneumatically connected to the chuck interior 130 at one or more vacuum ports 142 via one or more vacuum lines 144. The wafer chuck apparatus 100 is configured to support (mount) wafer 10 on top surface 112S of chuck 110 in a manner that substantially reduces or eliminates any deformation in the shape of wafer 10 so that the top surface of wafer 10 is substantially planar. This allows the top surface of wafer 10 (or IC chips embedded in the top surface) to be processed, e.g., using photolithographic techniques. More details of the configuration of chuck 110 are provided below.

The chuck 110 has a dimension (e.g., diameter) DC sized to accommodate wafers 10 having a range of diameters DW. The chuck 110 has a chuck axis AC that runs in the z-direction through a chuck center CC.

The wafer chuck apparatus 100 also includes a vacuum pump 140 pneumatically connected to the chuck interior 130 at one or more vacuum ports 142 via one or more vacuum lines 144. The wafer chuck apparatus 100 is configured to support (mount) wafer 10 on top surface 112S of chuck 110 in a manner that substantially reduces or eliminates any deformation in the shape of wafer 10 so that the top surface of wafer 10 is substantially planar. This allows the top surface of wafer 10 (or IC chips embedded in the top surface) to be processed, e.g., using photolithographic techniques. More details of the configuration of chuck 110 are provided below.

Wafers

With continuing reference to FIG. 1, wafer 10 has a top side 12, an opposite a backside 14 and a perimeter 13. The wafer 10 has a thickness TH and diameter DW and in an example is circular in shape. The wafer 10 also has a central axis AW that runs in the z-direction. Other shapes can also be used for wafer 10, such as square. In an example, wafer 10 can be a semiconductor (e.g., silicon) wafer, but other materials can be used, such as molded resin for packaging applications. The wafer 10 can also be formed by combining (i.e., interfacing) two or more substrates. The wafer 10 can also be constituted by a single material or by a single substrate. In an example, the wafer 10 is a reconstituted wafer, such as molded wafer used in wafer-level packaging.

The wafer 10 can have any reasonable diameter DW, including those typically used in semiconductor manufacturing, such as 150 mm, 200 mm and 300 mm or even larger.

Figure 2A:
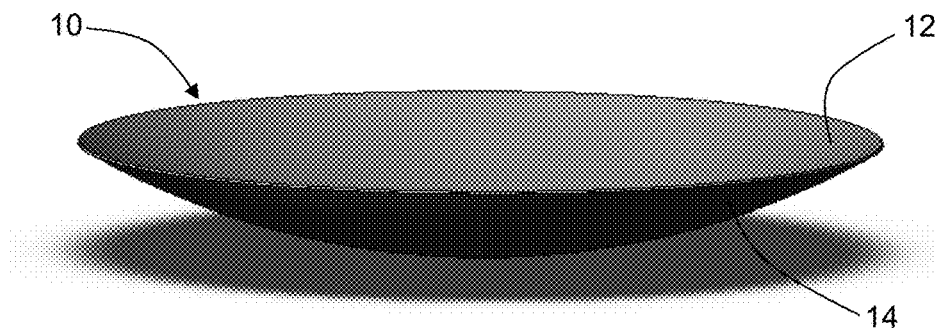
FIGS. 2A, 2B and 2C are elevated views of wafers illustrating three common forms of wafer deformation.
Figure 2B:
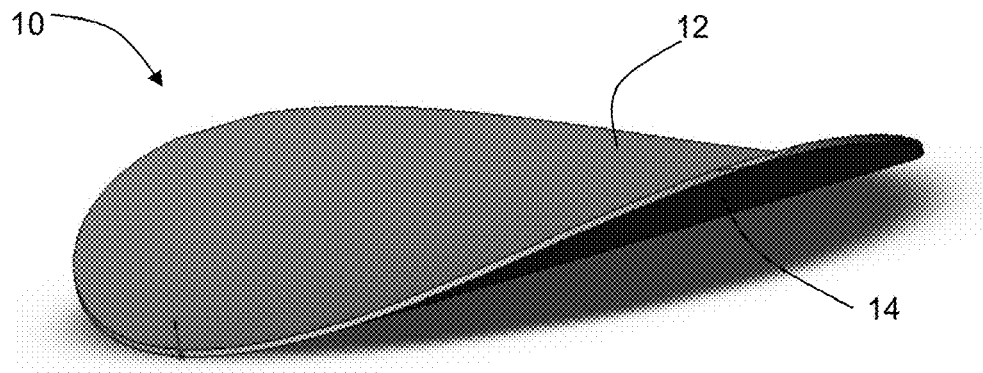
Figure 2C:
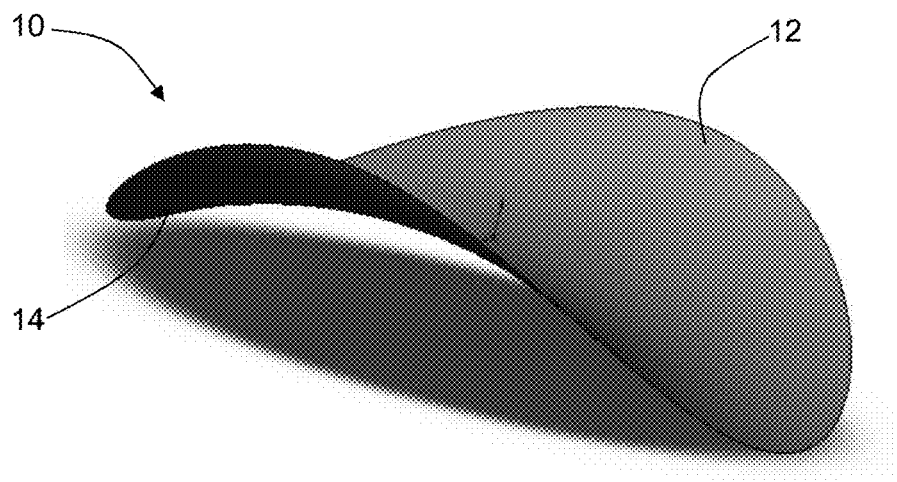

The wafer 10 shown in FIG. 1 has an ideal shape, namely perfectly planar. However, wafer 10 is more typically substantially deformed. FIGS. 2A, 2B and 2C are elevated views of wafer 10 showing example wafer deformations. FIG. 2A shows wafer 10 having a deformation called "bow." FIG. 2B shows wafer 10 having a "cylindrical" deformation. FIG. 2C shows wafer 10 having a "saddle" deformation. The wafer 10 can have other shaped deformations as well. In an example, warp can be large-scale deformations of wafer 10, i.e., that have a length scale of DW/3 to DW or DW/2 to DW. In another example, warp can also include smaller deformations, such as a vertical deformation of greater than 1 mm over a lateral dimension greater than 10 mm.

Figure 3A:
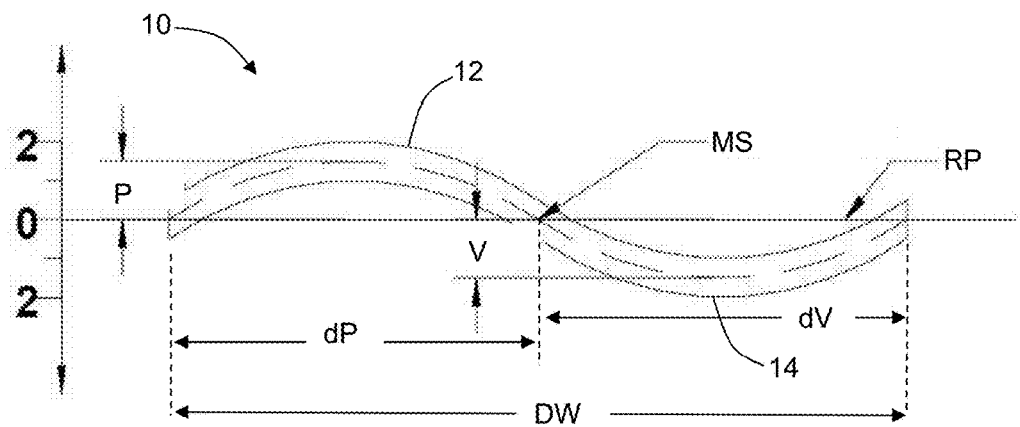
FIG. 3A is a cross-sectional view of an example wafer having a sinusoidal deformation and showing parameters used to quantify the amount of deformation.

FIG. 3A is a schematic cross-sectional view of wafer 10 having a sinusoidal deformation and illustrating parameters used to quantify the amount of deformation. The wafer 10 has a median surface MS and an x-y reference plane RP. The amount of deformation or warp W of wafer 10 can be expressed as the maximum peak-to-valley distance between the median surface MS and the reference plane RP, where P is the "peak" distance and "V" is the valley distance, where P and V are both positive numbers. In the case of the sinusoidal deformation of FIG. 3A, the amount of warp W=P+V. The distances dP and dV over which the peaks and valleys occur can also be taken into account by defining a relative warp $W_R$=P/dP+V/dV. The relative warp $W_R$ can also be defined in relation to the diameter DW of wafer 10, i.e., $W_R$=P/DW+V/DW. Other definitions of the amount of warp W can also be employed, and the three options for defining the amount of warp W discussed above are shown by way of example. In an example, the reference plane RP can be defined as the plane that minimizes the measurement of the warp W. In an example, the median surface MS lies mid-way between the top side 12 and the backside 14 of wafer 10.

Figure 3B:
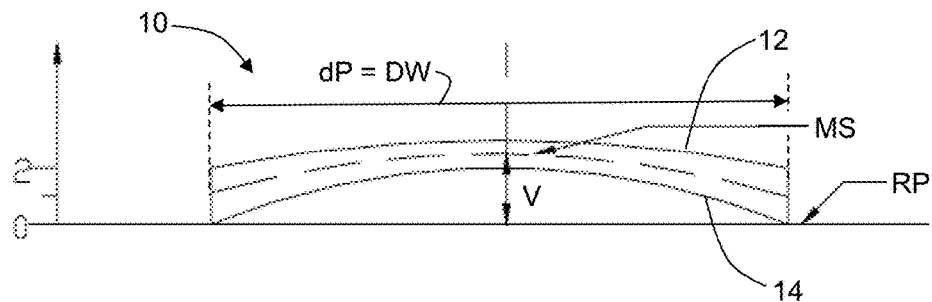
FIG. 3B is a cross-sectional view of an example wafer having a bow deformation.

FIG. 3B is similar to FIG. 3A and illustrates warp in the form of the bow deformation of FIG. 2A. The amount of warp W is given by W=P, since V=0. The relative warp $W_R$ is given by P/dP=P/DW, since the distance over which the peak occurs is the same as the diameter DW of wafer 10. The reference plane RP for a "bowed" wafer 10 can be taken as the plane that makes three points of contact with the backside 14 of wafer 10 at the outer edge of wafer 10.

Values of W=P+V can range from 1 mm to 10 mm. The higher the amount of warp W, the more difficult it is to properly mount the wafer 10 to the top surface 112S of chuck 110. Conventional wafer chuck apparatus are not designed for securing ("chucking") wafers that have substantial deformation, e.g., W>2 mm for a typical 300 mm wafer having a thickness of 775 microns. The ability of a given chuck to secure a given wafer and substantially reduce or remove the warp deformation while the wafer 10 is mounted depends on the wafer material and the thickness TH of wafer 10, characterized as stiffness, as well as the amount of warp W.

Micro-Channel Chuck

Figure 4:
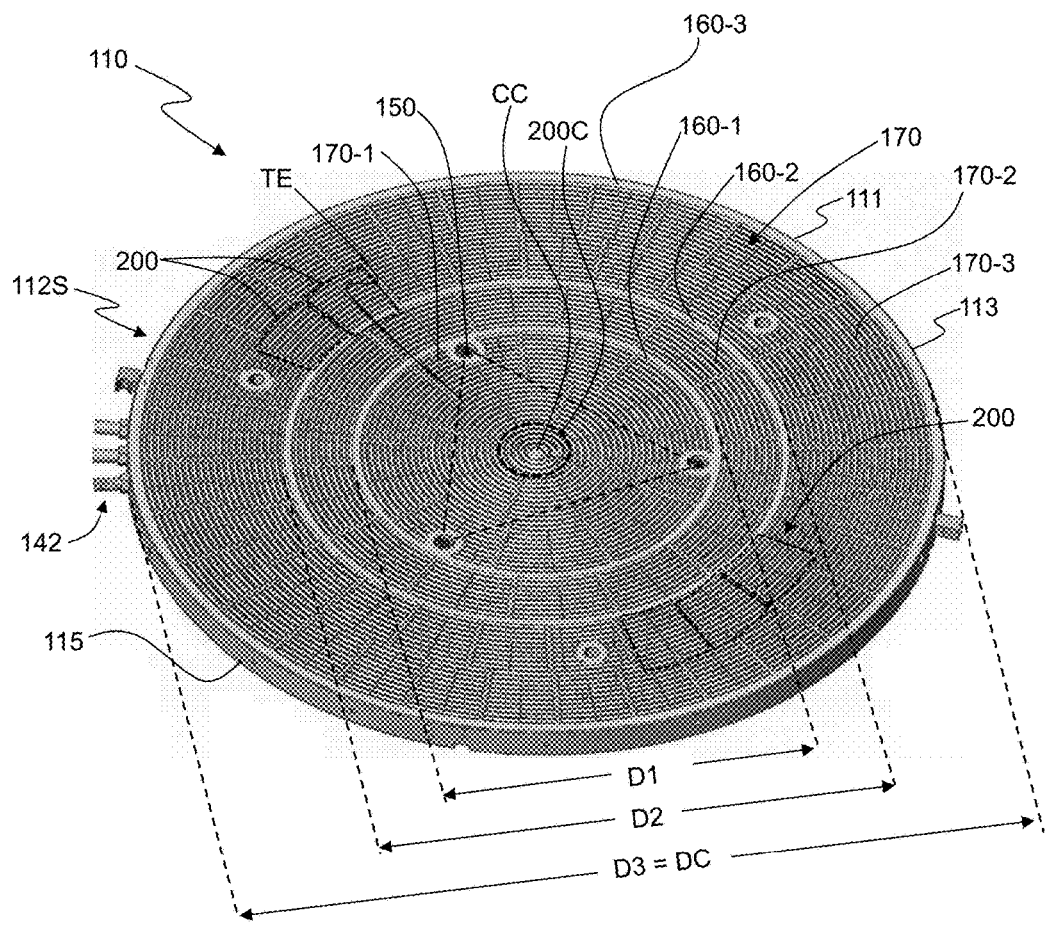
FIG. 4 is an elevated view of an example wafer chuck as disclosed herein showing an example configuration of micro-channel regions on the top surface.
Figure 5A:
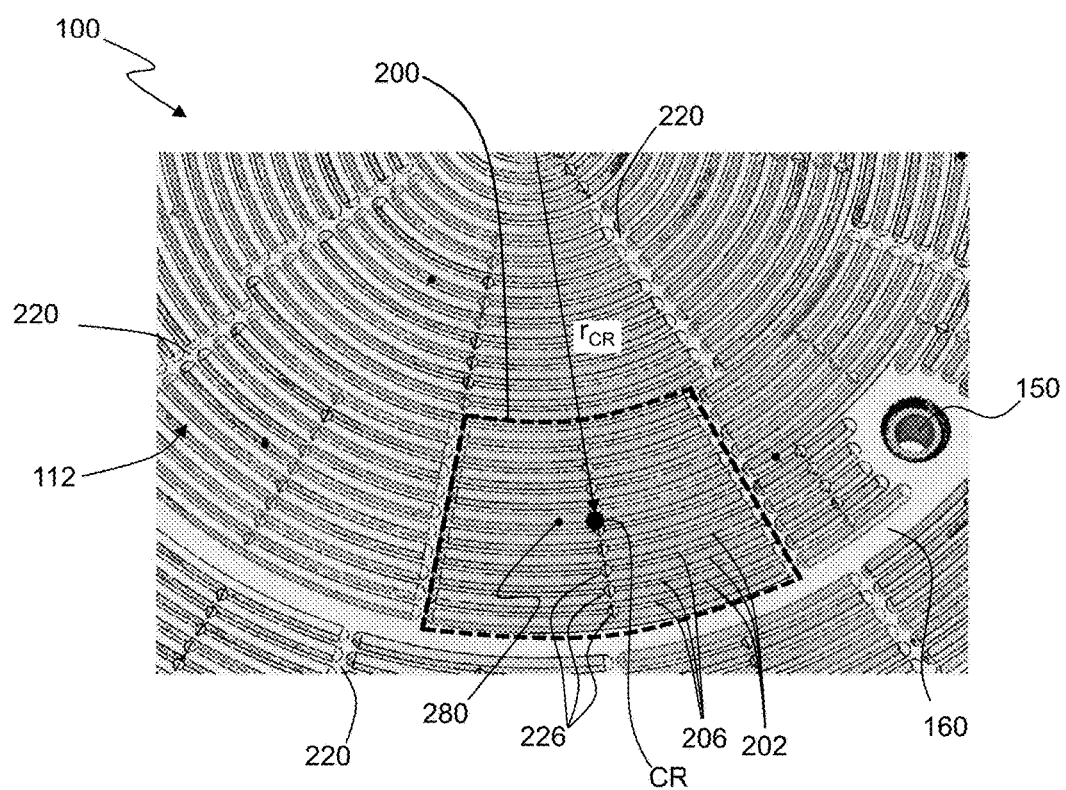
FIGS. 5A through 5C are close-up views of a portion of the top surface of the example wafer chuck of FIG. 4.
Figure 5B:
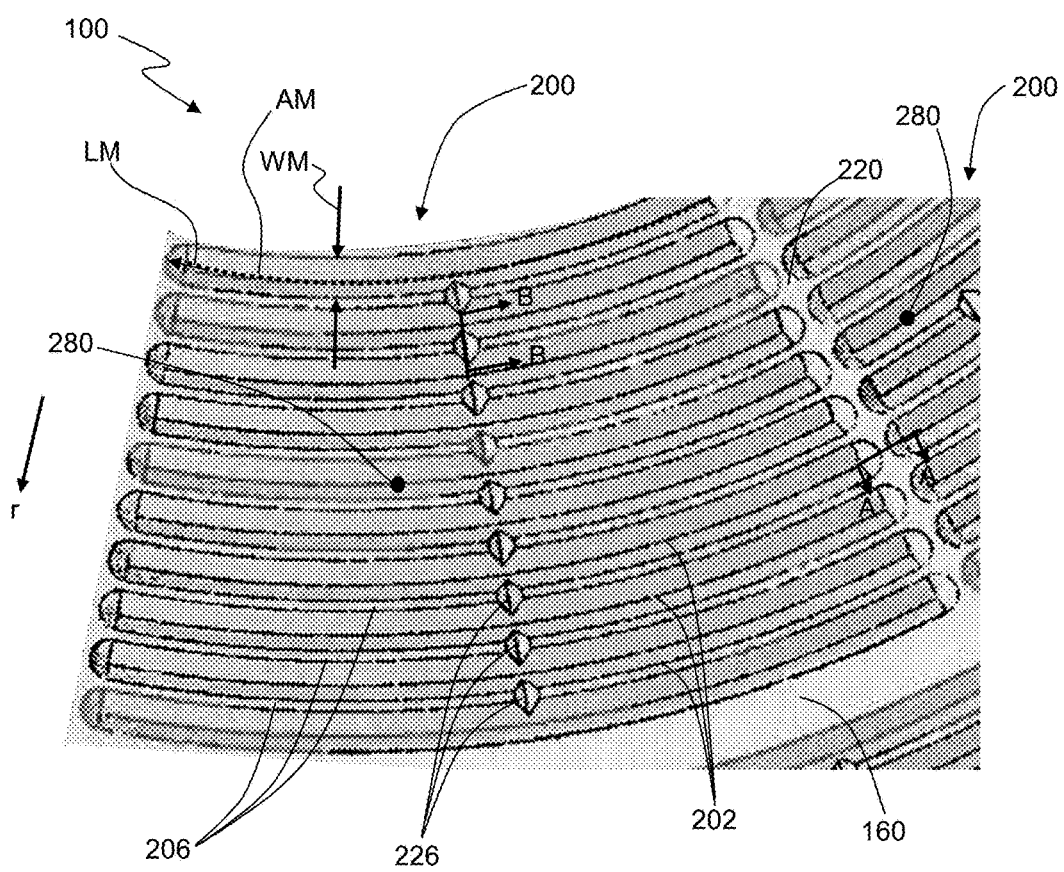
Figure 5C:
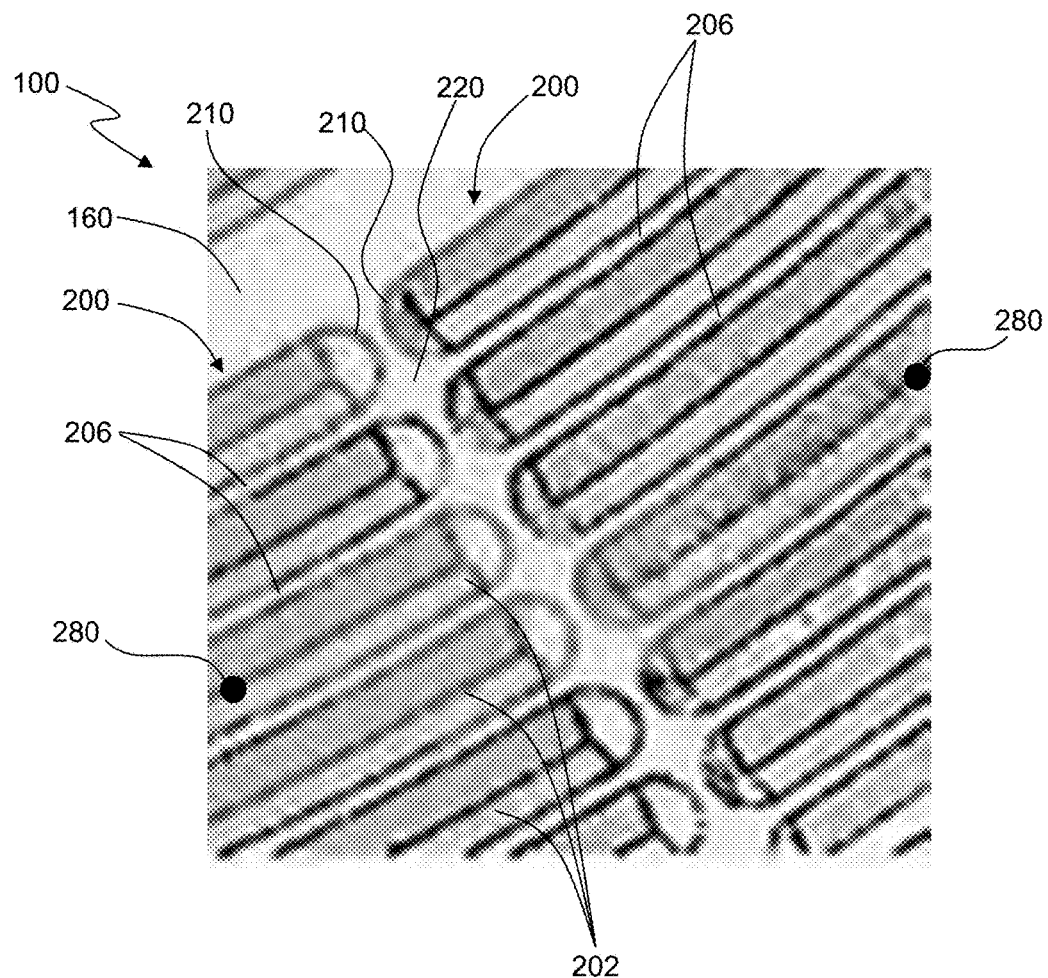
Figure 7:
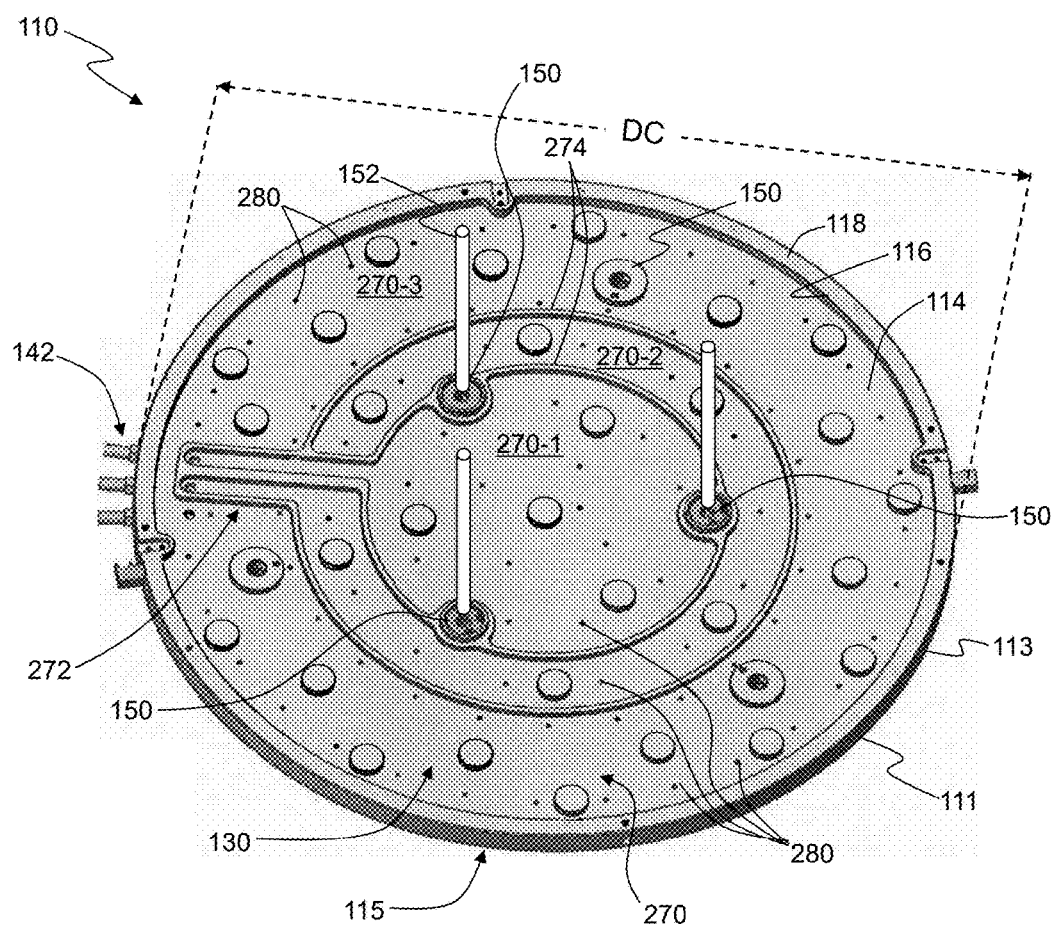
FIG. 7 is a bottom elevated view of the bottom side of the example chuck showing three separate manifold regions through which vacuum is provided to the micro-channel regions on the top surface of the chuck.

FIG. 4 is an elevated view of the top surface 112S of chuck 110. FIGS. 5A through 5C are close-up views of a portion of the top surface 112S of chuck 110. FIG. 7 is an elevated view of the chuck interior 130 and bottom surface or "backside" 114 of chuck 110, i.e., without plate 120 present.

The top side 112 of chuck 110 includes an array of micro-channel regions 200, as explained in greater detail below. The chuck 110 also includes three through-holes 150, which in the example shown are symmetrically arranged about the chuck center CC at the respective apexes of an equilateral triangle TE, which is centered on the chuck center CC and that resides just inside a first ring 160-1 of diameter D1. The through-holes 150 are sized to allow for lift pins 152 (see FIG. 7) to pass through the body 111 of chuck 110 for lifting and lowering wafer 10 onto the top surface 112S. The through-holes 150 are located so that wafers 10 having a diameter D1 or larger can be lifted from and lowered onto top surface 112S.

The chuck 110 includes a second ring 160-2 having a diameter D2 and a third ring 160-3 having a diameter D3. The first, second and third rings 160-1, 160-2 and 160-3 represent different size wafers 10 that can be accommodated by chuck 110. The first ring 160-1 defines a first vacuum region 170-1 that is circular and that includes chuck center CC. The first and second rings 160-1 and 160-2 define a second vacuum region 170-2 that has an annular shape. The second and third rings 160-2 and 160-3 define a third vacuum region 170-3 that also has an annular shape. Thus, in an example, the top side 112 of chuck 110 can be radially segmented to have one or multiple vacuum regions 170 to accommodate different sized wafers 10. Three vacuum regions 170 are shown by way of example.

With reference now to FIGS. 5A through 5C, each micro-channel region 200 includes an array of micro-channel sections 202. In an example, each micro-channel section 202 is curved and further in an example has a curvature centered on chuck center CC so that the micro-channels sections 202 within each micro-channel region 200 are substantially concentric. In an example, one of the micro-channel regions ("central micro-channel region") 200C of chuck 110 immediately surrounds chuck center CC and has circular (continuous) micro-channel sections 202.

Thus, in an example, the micro-channel regions 200 other than the central micro-channel region 200C have concentric arcuate micro-channel sections 202. The discussion below refers to micro-channel regions 200 other than the central micro-channel region 200C unless otherwise noted. In an example each micro-channel region 200 has the general shape of an annular section or a truncated wedge. FIG. 5A shows a center CR of a micro-channel region 200. The center CR can be defined to be halfway between the sides of the micro-channel region 200 that are radially closest to and farthest from the chuck center CC. The radial position to the center CR of a given micro-channel region 200 is measured from chuck center CC is denoted $r_{CR}$.

The micro-channel regions 200 are shown as being wedge-shaped and the micro-channel sections 202 are shown as being arcuate by way of example. Other shapes for the micro-channel regions 200 and micro-channel sections 202 can also be employed. Generally, micro-channel regions 200 and micro-channel sections 202 can be any shape that can be used to efficiently "tile" the top surface 112S of chuck 110. For example, polygonal shapes can be used (e.g., triangular, square, pentagonal, hexagonal, etc.). It is believed that the symmetry of the wedged-shaped micro-channel regions 200 and the arcuate micro-channel sections 202 are particularly well-suited for when the chuck 110 has a circular shape as shown.

With particular reference to FIG. 5B, the micro-channel sections 202 within a given micro-channel region 200 are separated by sidewalls 206. In an example, sidewalls 206 are arcuate and have the same general shape as the micro-channel sections 202. Each micro-channel section 202 is terminated by opposite end walls 210 (see FIG. 5C). The top surface 112S of chuck 110 that makes contact with the backside 14 of wafer 10 is defined by the top of sidewalls 206, ridges 220 and rings 160. In other words, the top surface 112S of chuck 110 has a surface area $A_S$ that is substantially less than that of the area $A_{CT}$ of the entire top side 112 of chuck 110, as discussed below.

Figure 6A:
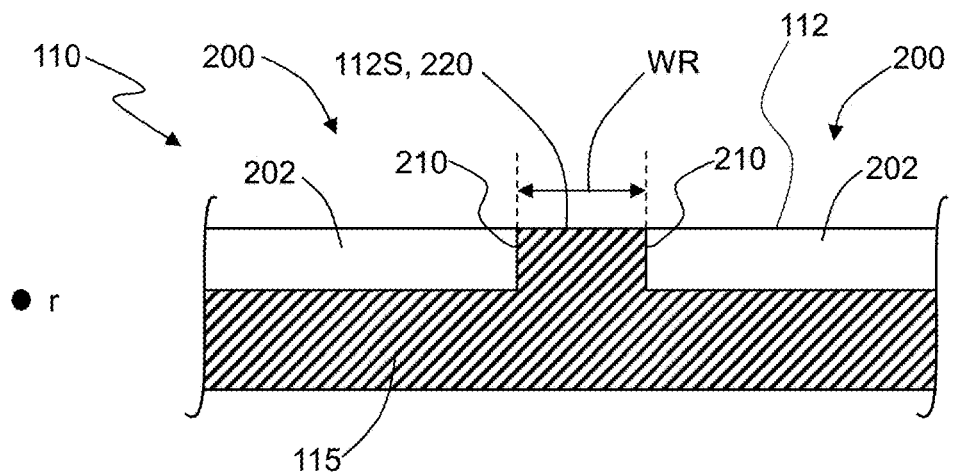
FIG. 6A is a close-up cut-away view of a portion of the chuck as taken along the line A-A in FIG. 5B and showing end walls of two micro-channels in different micro-channel regions that define the space between the micro-channel regions.

FIG. 6A is a close-up cut-away view of a portion of platen 115 as taken along the line A-A in FIG. 5B, i.e., looking in the radial direction inward toward chuck center CC (the r-coordinate is thus out of the page). FIG. 6A shows the end walls 210 of two micro-channel sections 202 that reside in different micro-channel regions 200 and which are spaced apart by a ridge 220 defined by the body of platen 115. The ridge 220 prevents pneumatic communication between adjacent micro-channel regions 200. Thus, the micro-channel regions 200 are pneumatically isolated from one another. The ridges 220 that separate adjacent micro-channels regions 200 have a width WR, which can be selected to define an amount of contact area for chuck 110, as described below. In an example, end walls 210 that in part define ridge 220 can be sloped so that the top surface 112S is smaller (i.e., has a smaller width WR) than the base of the ridge 220.

Figure 6B:
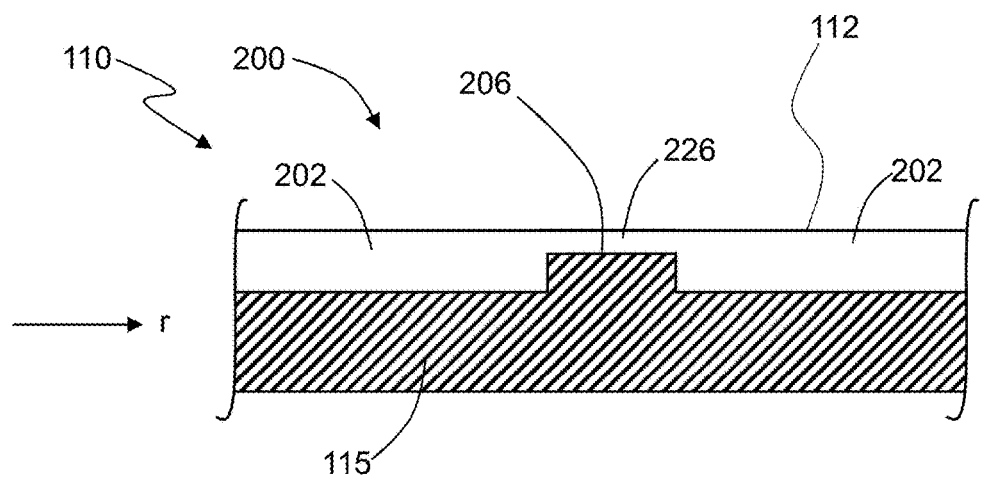
FIG. 6B is a close-up cut-away view of a portion of the chuck as taken along the line B-B in FIG. 5B and showing the groove formed in the sidewall between adjacent micro-channels within a micro-channel region that provides pneumatic communication between the micro-channels of a given micro-channel region.

FIG. 6B is a close-up cut-away view of a portion of platen 115 as taken along the line B-B in FIG. 5B. The r-coordinate is shown as running from left to right in FIG. 6B. FIG. 6B (as well as FIG. 5B) shows grooves 226 formed in sidewalls 206. The grooves 226 provide pneumatic communication between micro-channel sections 202 within a given micro-channel region 200. In an example, the grooves 226 are formed about mid-way between opposite end walls 210 of micro-channel section 202. Each micro-channel section 202 has a width WM, a curved central axis AM, and a length LM (see FIG. 5B) as measured along the curved central axis AM between end walls 210. Each micro-channel region 200 has a total area $A_{RT}$. Different micro-channels regions 200 can have different areas $A_{RT}$. In an example, micro-channel regions 200 that are centered on the same radius r (i.e., have the same radial position $r_{CR}$) have the same area $A_{RT}$.

FIG. 7 is a bottom elevated view of an example configuration of the backside 114 of platen 115 and chuck interior 130, i.e., without plate 120 present. The chuck interior 130 includes at least one manifold region 270 pneumatically connected to vacuum ports 142 via a vacuum conduit 144. The example of FIG. 7 shows three separate manifold regions 270-1, 270-2 and 270-3 that correspond to vacuum regions 170-1, 170-2 and 170-3 (see FIG. 4), respectively. The manifold regions 270-1, 270-2 and 270-3 are defined by interior walls 272 on backside 114 of chuck 110. Each interior wall 272 includes a circular portion 274. The use of multiple manifold regions 270 and corresponding vacuum regions 170 is to accommodate wafers 10 having different sizes (diameters), such the universal sizes of 150 mm, 200 mm and 300 mm diameter wafers. Thus, for chucking a wafer 10 having a diameter DW=D1=150 mm, only the innermost manifold region 270-1 and corresponding vacuum region 170-1 (FIG. 4) needs to be activated. In an example, chuck interior 130 can define a single manifold region 270.

Each manifold region 270 is pneumatically connected to the plurality of corresponding micro-channel regions 200 within a given vacuum region 170 via respective vacuum holes 280. In an example, there is one vacuum hole 280 per multi-channel region 200. In another example, there can be multiple vacuum holes 280 per multi-channel region 200. In an example, each vacuum hole 280 has diameter of about 0.5 mm.

As noted above, each micro-channel region 200 has a total surface area $A_{RT}$. Each micro-channel region 200 also has an amount of "contact area" $A_R$, which is defined by the top surface 112S of sidewalls 206 and ridges 220 within the micro-channel region 200. The area $A_R$ is referred to as the contact area because it represents the surface area within the micro-channel region 200 that actually makes contact with the backside 14 of wafer 10. Likewise, the amount of surface area associated with micro-channel sections 202 is referred to as the channel area $A_{MC}$. The total area $A_{RT}$ ("the micro-channel region area") and thus given by $A_{RT}=A_R+A_{MC}$. The total chuck top-side area is denoted $A_{CT}$ and for a circular chuck with diameter DC is given by $A_{CT}=\pi(DC/2)^2$. The total surface area of top surface 112S of chuck 110 is denoted $A_S$.

The micro-channel region contact-area ratio $R_{CR}=A_R/A_{RT}$ is a measure of the amount of contact area $A_R$ that the backside 14 of wafer 10 makes with top surface 112S within a given micro-channel region 200 relative to the total area $A_{RT}$ of the micro-channel region 200. In an example, the micro-channel region contact-area ratio $R_{CR}$ is in the range from $0.2 \leq R_{CR} \leq 0.35$ or $0.21 \leq R_{CR} \leq 0.31$. The values for the micro-channel region contact-area ratio $R_{CR}$ allow for particles, debris, etc. to be present on the top surface 112S of chuck 110 without substantially impacting the flatness of the wafer 10 secured on the top surface 112S of the chuck 110, while also providing sufficient contact area $A_R$ to the backside 14 of wafer 10 to avoid distorting the wafer 10 when it is chucked.

In an example, the total micro-channel region area $A_{RT}$ of each micro-channel region 200 is between 0.1% and 1.1% of the total chuck top-side area $A_{CT}$. This ensures that there are sufficient micro-channel regions 200 to properly secure wafer 10 while substantially reducing or removing the deformation in the wafer 10. For wafers 10 having a greater amount of deformation, it is generally beneficial to have more rather than fewer micro-channel regions 200. Examples of chuck 110 can have between 25 and 250 micro-channel regions 200 for a chuck diameter of DC=300 mm. In other examples, there are between 100 and 250 micro-channel regions 200.

Also in an example, the chuck contact-area ratio $R_{CT}=A_S/A_{CT}$ is the ratio of the contact area $A_S$ of top surface 112S as compared to the total chuck top-side area $A_{CT}$. This ratio $R_{CT}$ is thus a relative measure of the total contact area that the backside 14 of wafer 10 makes with the top surface 112S of chuck 110, and in an example is in the range $0.20 \leq R_{CT} \leq 0.35$ while in another example is in the range $0.21 \leq R_{CT} \leq 0.31$.

In the operation of chuck apparatus 100, wafer 10 is brought into contact with the top surface 112S of chuck 110, as shown in FIG. 1. The wafer 10 can have a substantial amount of deformation, e.g., wrap W in the range from 2 mm to 10 mm. Meanwhile, vacuum pump 140 is activated to cause a vacuum to form in one or more manifold regions 270. The vacuum in the one or more manifold regions 270 is in pneumatic communication with each micro-channel region 200 and so creates low pressure (suction) in each of these regions 200. In the discussion below, it is assumed there are a single manifold region 270 and a single corresponding vacuum region 170 for ease of discussion.

Assuming wafer 10 has a substantial deformation, only a portion of the backside 14 of wafer 10 makes contact with top surface 112S of chuck 110. That portion of the backside 14 will engage at least one low-pressure micro-channel region 200 and be brought into contact with the corresponding portion of top surface 112S. This in turn causes the adjacent portions of the backside 14 of wafer 10 to engage the adjacent low-pressure micro-channel regions 200. This process expands over the backside 14 of wafer 10 to eventually create a full seal of the backside 14 of wafer 10 to top surface 112S of chuck 110. This results in the amount of deformation from wafer 10 to be at least temporarily reduced or removed and allows for a relatively planar top surface for processing while the wafer 10 is mounted to the chuck 110.

The micro-channel regions 200 define discrete low-pressure contact areas that secure the wafer 10 by expanding from an initial contact area on backside 14 of wafer 10 to the full backside 14 of wafer 10 until the entire wafer 10 is engaged by chuck 110. The low value of the chuck contact-area ratio $R_{CT}$ means that there is a relatively small amount of contact between the top surface 112S and backside 14 of wafer 10.

The size of the micro-channel sections 202 can be varied as can the size and number of vacuum holes 280. The vacuum holes 280 need to be small enough to create a flow restriction such that the local low pressure can be established by maintaining a low pressure in the vacuum manifold regions 170 across the chuck 110.

The micro-channel region geometry for chuck 110 can be used in conjunction with other techniques to get wafer 10 to seal to the top surface 112S, such as pushing the wafer 10 down from the top or pulling it down from the bottom.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A chuck apparatus for supporting a wafer, comprising: a chuck body having a center, an interior and a top side with a top surface; a plurality of micro-channel regions formed in the top surface, with each micro-channel region comprising an array of concentric arcuate micro-channel sections that are in direct pneumatic communication with one another, the micro-channel regions being pneumatically isolated from one another; and at least one vacuum manifold region defined in the interior of the chuck body and that is in pneumatic communication with ones of the plurality of micro-channel regions through respective vacuum holes; wherein the top side includes a plurality of radially defined segments that each include one or more of the plurality of micro-channel regions.

2. The chuck apparatus according to claim 1, wherein the micro-channel sections within each micro-channel regions are defined by sidewalls having respective top surfaces that define the top surface of the chuck body.

3. The chuck apparatus according to claim 2, wherein the top surface of the chuck body has a contact area $A_S$, the top side of the chuck body has a total area $A_{CT}$, and wherein a chuck contact-area ratio $R_{CT}=A_S/A_{CT}$ is in the range $0.20 \leq R_{CT} \leq 0.35$.

4. The chuck apparatus according to claim 2, wherein each micro-channel region has a total area $A_{RT}$ and a contact surface area $A_R$, wherein a micro-channel region contact-area ratio $R_{CR}=A_R/A_{RT}$ is in the range $0.20 \leq R_{CR} \leq 0.35$.

5. The chuck apparatus according to claim 2, wherein a plurality of the sidewalls each include a transverse groove extending across the corresponding sidewall that provides the direct pneumatic communication between adjacent micro-channel sections.

6. The chuck apparatus according to claim 1, further comprising a vacuum pump pneumatically connected to the at least one vacuum manifold region.

7. The chuck apparatus according to claim 1, wherein the plurality of micro-channel regions is defined by between 25 and 250 micro-channel regions.

8. The chuck apparatus according to claim 1, further comprising at least three through holes formed in the chuck body and each sized to pass a lift pin.

* * * * *